United States Patent
Kawata

(10) Patent No.: US 11,943,943 B2
(45) Date of Patent: Mar. 26, 2024

(54) DETECTION DEVICE

(71) Applicant: Japan Display Inc., Tokyo (JP)

(72) Inventor: Yasushi Kawata, Tokyo (JP)

(73) Assignee: Japan Display Inc., Tokyo (JP)

( * ) Notice: Subject to any disclaimer, the term of this patent is extended or adjusted under 35 U.S.C. 154(b) by 288 days.

(21) Appl. No.: 17/411,268

(22) Filed: Aug. 25, 2021

(65) Prior Publication Data

US 2021/0384453 A1    Dec. 9, 2021

Related U.S. Application Data

(63) Continuation of application No. PCT/JP2020/000352, filed on Jan. 8, 2020.

(30) Foreign Application Priority Data

Mar. 20, 2019  (JP) .................................. 2019-052564
Sep. 17, 2019  (JP) .................................. 2019-168781

(51) Int. Cl.
*H01L 51/44*  (2006.01)
*G06V 40/13*  (2022.01)
(Continued)

(52) U.S. Cl.
CPC ......... *H10K 39/32* (2023.02); *G06V 40/1318* (2022.01); *H10K 19/20* (2023.02);
(Continued)

(58) Field of Classification Search
CPC ........ H10K 39/32; H10K 19/20; H10K 30/40; G06V 40/1318
See application file for complete search history.

(56) References Cited

U.S. PATENT DOCUMENTS 8,670,054 B2    3/2014  Tazikawa
10,381,413 B2 *  8/2019  Yun ........................ H10K 39/32
10,818,857 B2 * 10/2020  Liang .................... H10K 30/353
(Continued)

FOREIGN PATENT DOCUMENTS

JP    2011-040518 A    2/2011
JP    2012-049289 A    3/2012
JP    2017-112376      6/2017

OTHER PUBLICATIONS

International Search Report issued in International Patent Application No. PCT/JP2020/000352 dated Mar. 17, 2020 and English translation of same. 5 pages.

(Continued)

*Primary Examiner* — Jarrett J Stark
(74) *Attorney, Agent, or Firm* — K&L Gates LLP

(57) ABSTRACT

A detection device includes a substrate, a plurality of detection electrodes arranged in a detection area of the substrate, an organic semiconductor layer that covers the detection electrodes, and a counter electrode provided above the organic semiconductor layer. The organic semiconductor layer includes at least either of a first p-type semiconductor layer and a first n-type semiconductor layer, and an active layer. The active layer is provided in each overlapping area overlapping a corresponding one of the detection electrodes, and has a structure in which a p-type semiconductor area and an n-type semiconductor area are mixed and coexist. The first p-type semiconductor layer or the first n-type semiconductor layer is provided in a non-overlapping area not overlapping the detection electrode, and is provided between the adjacent active layers.

6 Claims, 10 Drawing Sheets

(51) Int. Cl.
  *H10K 19/20* (2023.01)
  *H10K 30/40* (2023.01)
  *H10K 30/81* (2023.01)
  *H10K 39/32* (2023.01)
  *H10K 30/00* (2023.01)

(52) U.S. Cl.
  CPC ............. *H10K 30/40* (2023.02); *H10K 30/81* (2023.02); *H10K 30/451* (2023.02)

(56) References Cited

U.S. PATENT DOCUMENTS

| | | | | |
|---|---|---|---|---|
| 2009/0151787 A1* | 6/2009 | Yoshikawa | ............ | H10K 30/30 257/E51.026 |
| 2009/0165857 A1* | 7/2009 | Naito | ................... | H10K 30/211 136/261 |
| 2012/0199186 A1* | 8/2012 | Okubo | ................... | B82Y 10/00 136/255 |
| 2012/0211741 A1* | 8/2012 | Kato | ..................... | H10K 30/30 257/E51.012 |
| 2012/0241003 A1* | 9/2012 | Wachi | ................. | H10K 30/353 136/263 |
| 2012/0312364 A1* | 12/2012 | Uhrich | .................. | H10K 30/88 136/255 |
| 2013/0161596 A1* | 6/2013 | Huang | .................. | H10K 30/80 257/431 |
| 2013/0342722 A1 | 12/2013 | Kuboi | | |
| 2014/0000716 A1* | 1/2014 | Eu | ........................ | C08G 61/123 526/240 |
| 2014/0231781 A1* | 8/2014 | Imai | ....................... | H10K 30/88 257/40 |
| 2015/0060773 A1* | 3/2015 | Liang | .................. | H10K 30/353 257/40 |
| 2017/0170238 A1 | 6/2017 | Lee et al. | | |
| 2019/0181183 A1 | 6/2019 | Lee et al. | | |
| 2020/0111841 A1 | 4/2020 | Lee et al. | | |
| 2020/0274077 A1* | 8/2020 | Ujiie | ....................... | H01L 31/10 |
| 2023/0200097 A1* | 6/2023 | Choi | .................... | H10K 85/311 257/40 |

OTHER PUBLICATIONS

Written Opinion issued in International Patent Application No. PCT/JP2020/000352 dated Mar. 17, 2020. 4 pages.

* cited by examiner

DETECTION DEVICE

CROSS-REFERENCE TO RELATED APPLICATION

This application claims the benefit of priority from Japanese Patent Application No. 2019-052564 filed on Mar. 20, 2019, Japanese Patent Application No. 2019-168781 filed on Sep. 17, 2019, and International Patent Application No. PCT/JP2020/000352 filed on Jan. 8, 2020, the entire contents of which are incorporated herein by reference.

BACKGROUND

1. Technical Field

What is disclosed herein relates to a detection device.

2. Description of the Related Art

In these years, optical biosensors are known as biosensors used, for example, for personal authentication. For example, fingerprint sensors and vein sensors are known as the optical biosensors. Such an optical biosensor includes a photoelectric conversion element, such as a photodiode. The photoelectric conversion element outputs a signal that changes with an amount of irradiating light. Japanese Patent Application Laid-open Publication No. 2017-112376 (JP-A-2017-112376) discloses a technology that uses an organic photoelectric layer constituted by organic semiconductors as the photoelectric conversion elements. In JP-A-2017-112376, the organic photoelectric layer and an upper transparent electrode layer are provided in this order above a plurality of detection electrodes (a lower transparent electrode layer in JP-A-2017-112376).

In JP-A-2017-112376, since the organic photoelectric layer is provided across the detection electrodes, a leakage current may occur between the adjacent detection electrodes. Therefore, when the technology of JP-A-2017-112376 is applied to an optical biosensor, high resolution of detection may be difficult to be achieved.

SUMMARY

A detection device according to one aspect of the present disclosure includes a substrate; a plurality of detection electrodes arranged in a detection area of the substrate; an organic semiconductor layer covering the detection electrodes; and a counter electrode provided above the organic semiconductor layer. The organic semiconductor layer includes at least either of a first p-type semiconductor layer and a first n-type semiconductor layer, and an active layer. The active layer is provided in each overlapping area overlapping a corresponding one of the detection electrodes, and has a structure in which a p-type semiconductor and an n-type semiconductor are mixed and coexist. The first p-type semiconductor layer or the first n-type semiconductor layer is provided in a non-overlapping area not overlapping the detection electrode, and is provided between the adjacent active layers.

DETAILED DESCRIPTION

Figure 1:
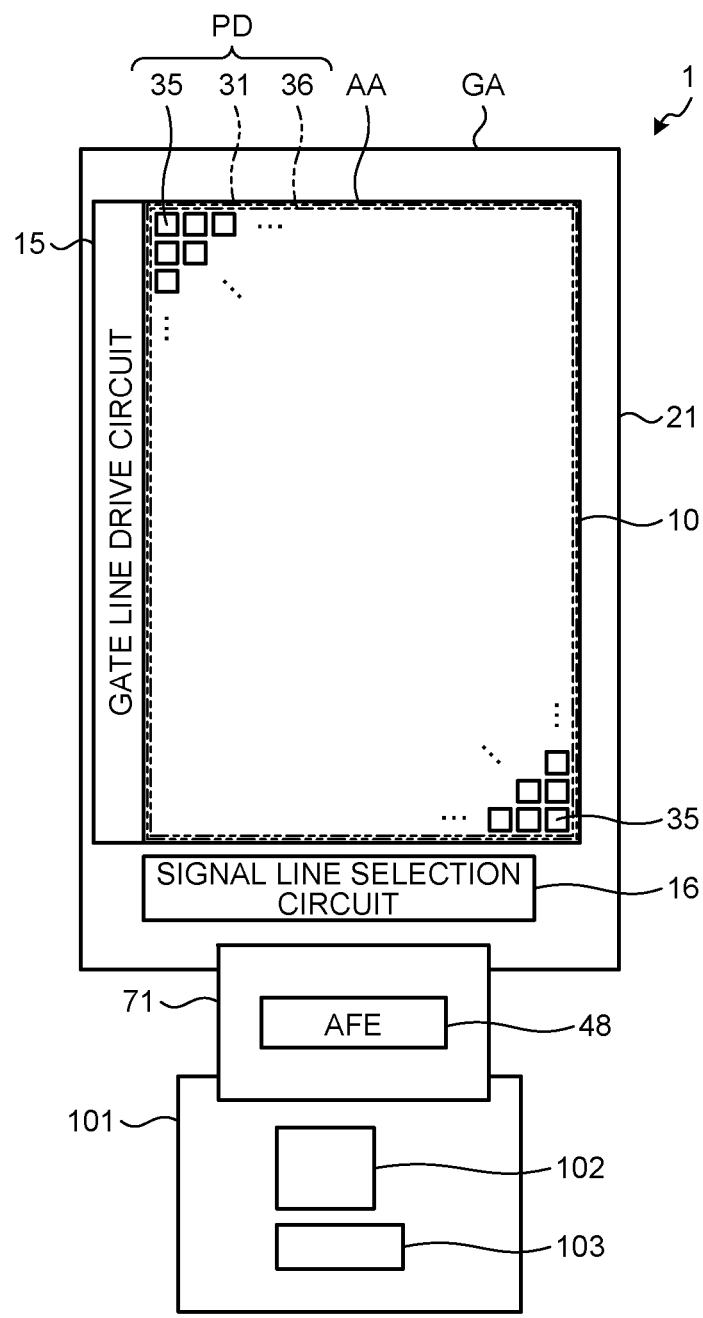
FIG. 1 is a plan view illustrating a detection device according to a first embodiment of the present disclosure.

The following describes aspects (embodiments) for carrying out the present disclosure in detail with reference to the drawings. The present disclosure is not limited to the description of the embodiments given below. Components to be described below include those easily conceivable by those skilled in the art or those substantially identical thereto. Moreover, the components to be described below can be appropriately combined. What is disclosed herein is merely an example, and the present disclosure naturally encompasses appropriate modifications easily conceivable by those skilled in the art while maintaining the gist of the disclosure. To further clarify the description, the drawings schematically illustrate, for example, widths, thicknesses, and shapes of various parts as compared with actual aspects thereof, in some cases. However, they are merely examples, and interpretation of the present disclosure is not limited thereto. The same element as that illustrated in a drawing that has already been discussed is denoted by the same reference numeral through the description and the drawings, and detailed description thereof will not be repeated in some cases where appropriate.

First Embodiment

Figure 2:
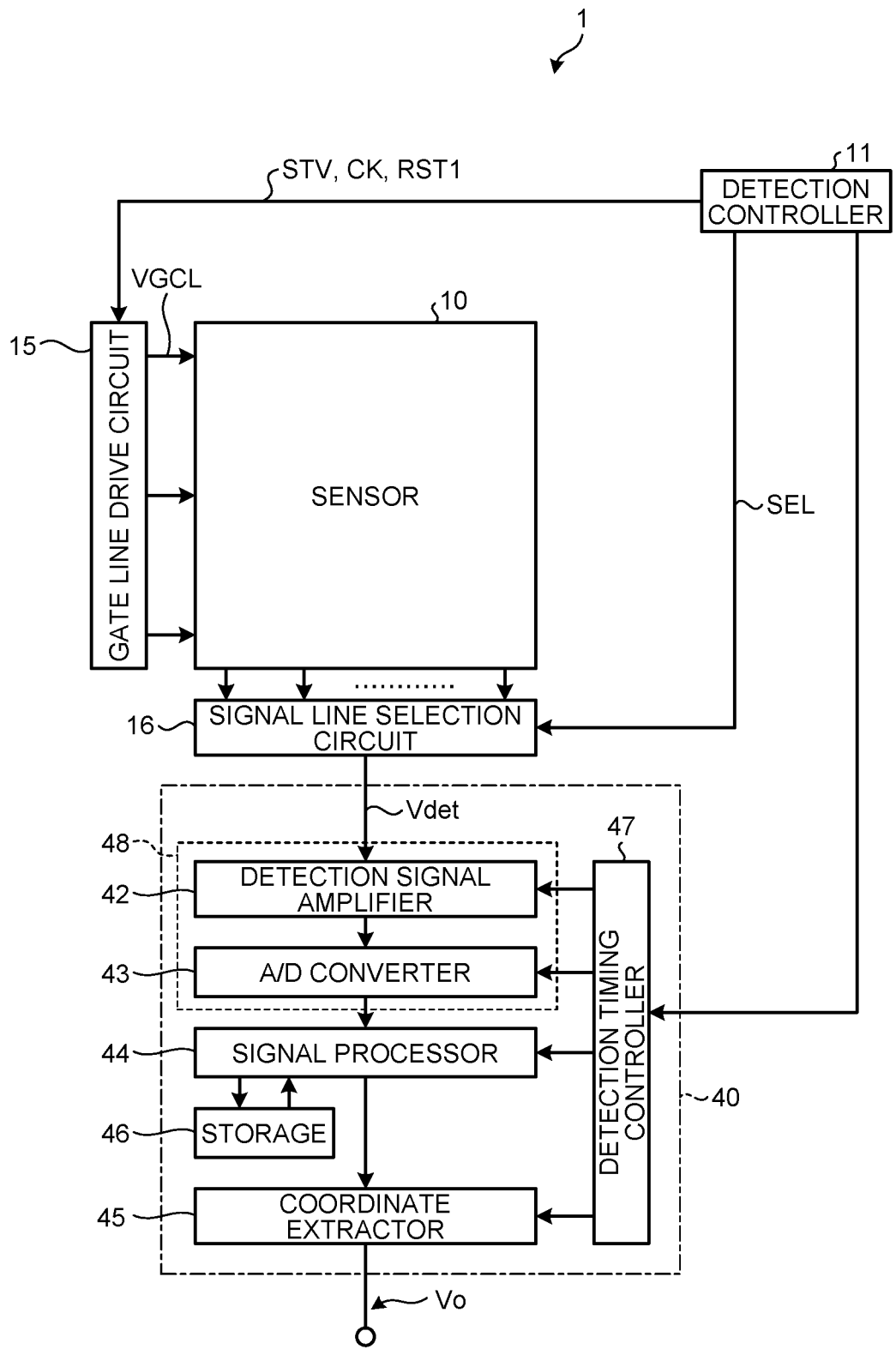
FIG. 2 is a block diagram illustrating a configuration example of the detection device according to the first embodiment.

FIG. 1 is a plan view illustrating a detection device according to a first embodiment of the present disclosure. FIG. 2 is a block diagram illustrating a configuration example of the detection device according to the first embodiment. As illustrated in FIG. 1, a detection device 1 includes an insulating substrate 21, a sensor 10, a gate line drive circuit 15, a signal line selection circuit 16, a detection circuit 48, a control circuit 102, and a power supply circuit 103.

As illustrated in FIG. 1, a control board 101 is electrically coupled to the insulating substrate 21 through a flexible printed circuit board 71. The flexible printed circuit board 71 is provided with the detection circuit 48. The control board 101 is provided with the control circuit 102 and the power supply circuit 103. The control circuit 102 is, for example, a field programmable gate array (FPGA). The control circuit 102 supplies control signals to the sensor 10, the gate line drive circuit 15, and the signal line selection circuit 16 to control a detection operation of the sensor 10. The power supply circuit 103 supplies voltage signals including, for example, a power supply signal SVS (refer to FIG. 4), to the sensor 10 and the gate line drive circuit 15.

The insulating substrate 21 has a detection area AA and a peripheral area GA. The detection area AA is an area overlapping a plurality of detection electrodes 35, a counter electrode 36, and an organic semiconductor layer 31 included in the sensor 10. The peripheral area GA is an area outside the detection area AA, and is an area not overlapping the detection electrodes 35. The gate line drive circuit 15 and the signal line selection circuit 16 are provided in the peripheral area GA.

The sensor 10 includes the organic semiconductor layer 31, the detection electrodes 35, and the counter electrode 36. The detection electrodes 35 are arranged in the detection area AA of the insulating substrate 21. The organic semiconductor layer 31 is continuously provided in the entire detection area AA so as to cover the detection electrodes 35. The counter electrode 36 is provided above the organic semiconductor layer 31. The organic semiconductor layer 31, each of the detection electrodes 35, and the counter electrode 36 constitute a photoelectric conversion element PD (photodiode) in an area overlapping a corresponding one of the detection electrodes 35. In other words, the photoelectric conversion elements PD are provided corresponding to the respective detection electrodes 35, and are arranged in the detection area AA.

As illustrated in FIG. 2, the detection device 1 further includes a detection controller 11 and a detector 40. The control circuit 102 includes some or all functions of the detection controller 11. The control circuit 102 also includes some or all functions of the detector 40. In FIG. 1, the detection circuit 48 is provided on the flexible printed circuit board 71. However, the detection circuit 48 may be incorporated in the control circuit 102.

The sensor 10 is an optical sensor including the photoelectric conversion elements PD. Each of the photoelectric conversion elements PD included in the sensor 10 outputs an electrical signal corresponding to light emitted thereto as a detection signal Vdet to the signal line selection circuit 16. The sensor 10 performs the detection in response to a gate drive signal VGCL supplied from the gate line drive circuit 15.

The detection controller 11 is a circuit that supplies respective control signals to the gate line drive circuit 15, the signal line selection circuit 16, and the detector 40 to control operations thereof. The detection controller 11 supplies various control signals including, for example, a start signal STV, a clock signal CK, and a reset signal RST1 to the gate line drive circuit 15. The detection controller 11 also supplies various control signals including, for example, a selection signal SEL to the signal line selection circuit 16.

The gate line drive circuit 15 is a circuit that drives a plurality of gate lines GCL (refer to FIG. 3) based on the various control signals. The gate line drive circuit 15 sequentially or simultaneously selects the gate lines GCL, and supplies the gate drive signals VGCL to the selected gate lines GCL. Through this operation, the gate line drive circuit 15 selects the photoelectric conversion elements PD coupled to the gate lines GCL.

Figure 3:
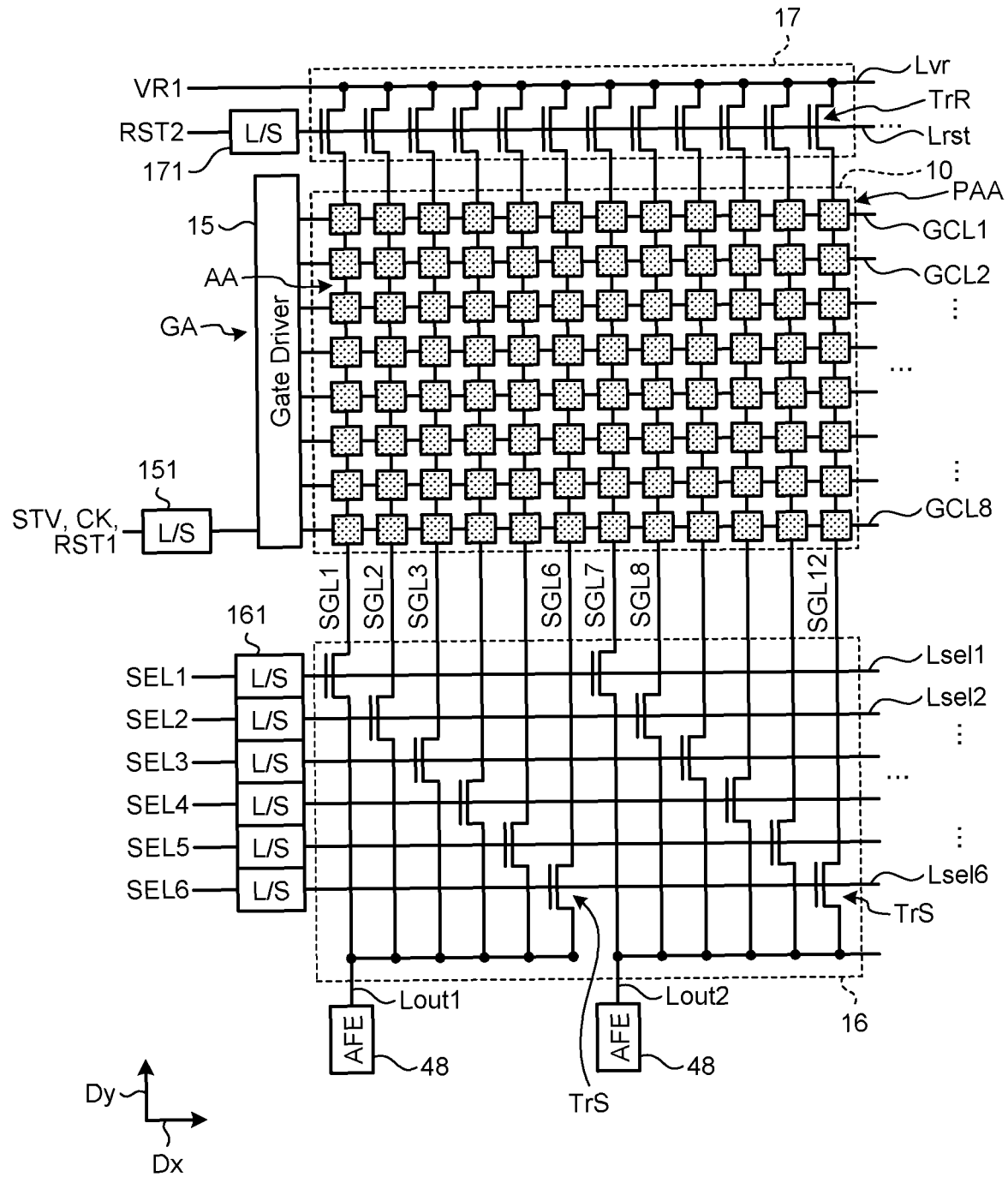
FIG. 3 is a circuit diagram illustrating the detection device.

The signal line selection circuit 16 is a switch circuit that sequentially or simultaneously selects a plurality of signal lines SGL (refer to FIG. 3). The signal line selection circuit 16 couples the selected signal lines SGL to the detection circuit 48 based on the selection signal SEL supplied from the detection controller 11. Through this operation, the signal line selection circuit 16 outputs the detection signal Vdet of each of the photoelectric conversion elements PD to the detector 40.

The detector 40 includes the detection circuit 48, a signal processor 44, a coordinate extractor 45, a storage 46, and a detection timing controller 47. The detection timing controller 47 controls, based on a control signal supplied from the detection controller 11, the detection circuit 48, the signal processor 44, and the coordinate extractor 45 so as to operate in synchronization with one another.

The detection circuit 48 is, for example, an analog front-end circuit (AFE). The detection circuit 48 is a signal processing circuit having functions of at least a detection signal amplifier 42 and an analog-to-digital (A/D) converter 43. The detection signal amplifier 42 amplifies the detection signal Vdet. The A/D converter 43 converts an analog signal output from the detection signal amplifier 42 into a digital signal.

The signal processor 44 is a logic circuit that detects a predetermined physical quantity input to the sensor 10 based on an output signal of the detection circuit 48. When a finger Fg is in contact with or in proximity to a detection surface, the signal processor 44 can detect asperities of a surface of the finger Fg or a palm based on the signal from the detection circuit 48. The signal processor 44 can also detect biological information based on the signal from the detection circuit 48. Examples of the biological information include a blood vessel image of the finger Fg or the palm, a pulse wave, pulsation, and a blood oxygen concentration.

The storage 46 temporarily stores a signal calculated by the signal processor 44. The storage 46 may be, for example, a random-access memory (RAM) or a register circuit.

The coordinate extractor 45 is a logic circuit that obtains detected coordinates of the asperities of the surface of, for example, the finger Fg when the contact or the proximity of the finger Fg is detected by the signal processor 44. The coordinate extractor 45 combines the detection signals Vdet output from the photoelectric conversion elements PD of the sensor 10 to generate two-dimensional information representing a shape of the asperities of the surface of, for example, the finger Fg and two-dimensional information representing shapes of blood vessels of the finger Fg and the palm. The coordinate extractor 45 may output the detection signals Vdet as sensor outputs Vo, without calculating the detected coordinates.

Figure 4:
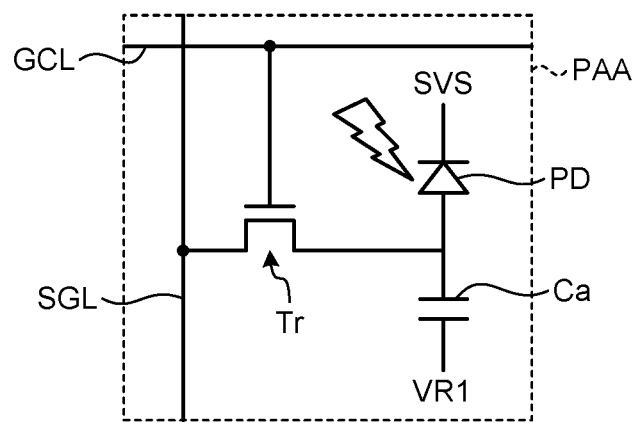
FIG. 4 is a circuit diagram illustrating a partial detection area.

The following describes a circuit configuration example and an operation example of the detection device 1. FIG. 3 is a circuit diagram illustrating the detection device. FIG. 4 is a circuit diagram illustrating a partial detection area.

As illustrated in FIG. 3, the sensor 10 has a plurality of partial detection areas PAA arranged in a matrix having a row-column configuration. As illustrated in FIG. 4, each of the partial detection areas PAA includes the photoelectric conversion element PD, a capacitive element Ca, and a first switching element Tr. The first switching element Tr is provided corresponding to each of the detection electrodes 35 included in the photoelectric conversion element PD. The first switching element Tr is constituted by a thin-film transistor, and in this example, constituted by an n-channel metal oxide semiconductor (MOS) thin-film transistor (TFT). The gate of the first switching element Tr is coupled to each of the gate lines GCL. The source of the first switching element Tr is coupled to each of the signal lines SGL. The drain of the first switching element Tr is coupled to the anode of the photoelectric conversion element PD and the capacitive element Ca.

The cathode of the photoelectric conversion element PD is supplied with the power supply signal SVS from the power supply circuit 103. The photoelectric conversion element PD is driven in a reverse bias state. The capacitive element Ca is supplied with a reference signal VR1 serving as an initial potential of the capacitive element Ca from the power supply circuit 103.

When the partial detection area PAA is irradiated with light, a current corresponding to an amount of the light flows through the photoelectric conversion element PD. As a result, an electrical charge is stored in the capacitive element Ca. After the first switching element Tr is turned on, a current corresponding to the electrical charge stored in the capacitive element Ca flows through the signal line SGL. The signal line SGL is coupled to the detection circuit 48 through the signal line selection circuit 16. Thus, the detection device 1 can detect a signal corresponding to the amount of the light emitted to the photoelectric conversion element PD for each of the partial detection areas PAA.

As illustrated in FIG. 3, the gate lines GCL extend in a first direction Dx, and are coupled to the partial detection areas PAA arranged in the first direction Dx. A plurality of gate lines GCL1, GCL2, ..., GCL8 are arranged in a second direction Dy, and are each coupled to the gate line drive circuit 15. In the following description, the gate lines GCL1, GCL2, ..., GCL8 will each be simply referred to as the gate line GCL when need not be distinguished from one another. Although the number of the gate lines GCL is eight, this is merely an example. Eight or more, such as 256, of the gate lines GCL may be arranged.

The first direction Dx is a direction in a plane parallel to the insulating substrate 21, and is, for example, a direction parallel to the gate lines GCL. The second direction Dy is a direction in a plane parallel to the insulating substrate 21, and is a direction orthogonal to the first direction Dx. The second direction Dy may intersect the first direction Dx without being orthogonal thereto.

The signal lines SGL extend in the second direction Dy, and are coupled to the partial detection areas PAA arranged in the second direction Dy. A plurality of signal lines SGL1, SGL2, ..., SGL12 are arranged in the first direction Dx, and are each coupled to the signal line selection circuit 16 and a reset circuit 17. Although the number of the signal lines SGL is 12, this is merely an example. Twelve or more, such as 252, of the signal lines SGL may be arranged. In FIG. 3, the sensor 10 is provided between the signal line selection circuit 16 and the reset circuit 17. The present disclosure is not limited thereto. The signal line selection circuit 16 and the reset circuit 17 may be coupled to the same ends of the signal lines SGL.

The gate line drive circuit 15 receives the various control signals such as the start signal STV, the clock signal CK, and the reset signal RST1 through a level shifter 151. The gate line drive circuit 15 includes a plurality of second switching elements TrG (refer to FIG. 6), and sequentially selects the gate lines GCL1, GCL2, ..., GCL8 in a time-division manner through operations of the second switching elements TrG. The gate line drive circuit 15 supplies the gate drive signals VGCL to the first switching elements Tr through the selected gate lines GCL. This operation selects the partial detection areas PAA arranged in the first direction Dx as detection targets.

The signal line selection circuit 16 includes a plurality of selection signal lines Lsel, a plurality of output signal lines Lout, and third switching elements TrS. The third switching elements TrS are provided corresponding to the respective signal lines SGL. Six of the signal lines SGL1, SGL2, ..., SGL6 are coupled to a common output signal line Lout1. Six of the signal lines SGL7, SGL8, ..., SGL12 are coupled to a common output signal line Lout2. The output signal lines Lout1 and Lout2 are each coupled to the detection circuit 48.

The signal lines SGL1, SGL2, ..., SGL6 are grouped into a first signal line block, and the signal lines SGL7, SGL8, ..., SGL12 are grouped into a second signal line block. The selection signal lines Lsel are coupled to the gates of the respective third switching elements TrS included in one of the signal line blocks. One of the selection signal lines Lsel is coupled to the gates of the third switching elements TrS in the signal line blocks. Specifically, selection signal lines Lsel1, Lsel2, ..., Lsel6 are coupled to the third switching elements TrS corresponding to the signal lines SGL1, SGL2, ..., SGL6. One of the selection signal lines Lsel1 is coupled to one of the third switching elements TrS corresponding to the signal line SGL1 and one of the third switching elements TrS corresponding to the signal line SGL7. In the same manner, the selection signal line Lsel2 is coupled to one of the third switching elements TrS corresponding to the signal line SGL2 and one of the third switching elements TrS corresponding to the signal line SGL8.

The control circuit 102 (refer to FIG. 1) sequentially supplies the selection signals SEL to the selection signal lines Lsel through level shifters 161. This operation causes the signal line selection circuit 16 to operate the third switching elements TrS to sequentially select the signal lines SGL in one of the signal line blocks in a time-division manner. The signal line selection circuit 16 simultaneously selects one of the signal lines SGL in each of the signal line blocks. With the above-described configuration, the detection device 1 can reduce the number of integrated circuits (ICs) including the detection circuit 48 or the number of terminals of the ICs.

As illustrated in FIG. 3, the reset circuit 17 includes a reference signal line Lvr, a reset signal line Lrst, and fourth switching elements TrR. The fourth switching elements TrR are provided corresponding to the signal lines SGL. The reference signal line Lvr is coupled to either the sources or the drains of the fourth switching elements TrR. The reset signal line Lrst is coupled to the gates of the fourth switching elements TrR.

The control circuit 102 supplies a reset signal RST2 to the reset signal line Lrst through a level shifter 171. This operation turns on the fourth switching elements TrR to electrically couple the signal lines SGL to the reference signal line Lvr. The power supply circuit 103 supplies the reference signal VR1 to the reference signal line Lvr. This operation supplies the reference signal VR1 to the capacitive elements Ca included in the partial detection areas PAA.

The detection device 1 includes a reset period, an exposure period, and a reading period. The power supply circuit 103 supplies the power supply signal SVS to the cathode of the photoelectric conversion element PD through the reset period, the exposure period, and the reading period. During the reset period, the gate line drive circuit 15 sequentially selects the gate lines GCL, and sequentially supplies the gate drive signals VGCL to the gate lines GCL. Thus, during the reset period, the capacitive elements Ca of all the partial detection areas PAA are sequentially electrically coupled to the signal lines SGL, and are supplied with the reference signal VR1. As a result, capacities of the capacitive elements Ca are reset.

During the exposure period, the respective first switching elements Tr are turned off, and the current corresponding to the light irradiating the photoelectric conversion element PD flows in each of the partial detection areas PAA. As a result, the electrical charge is stored in each of the capacitive elements Ca.

During the reading period, the gate line drive circuit 15 sequentially supplies the gate drive signals VGCL to the gate lines GCL. This operation turns on the respective first switching elements Tr. The control circuit 102 sequentially supplies selection signals SEL1, . . . , SEL6 to the signal line selection circuit 16. This operation sequentially or simultaneously couples the signal lines SGL of the partial detection areas PAA selected by the gate drive signals VGCL to the detection circuit 48. As a result, the detection signals Vdet are supplied to the detection circuit 48 on a per partial detection area PAA basis.

The detection device 1 may perform the detection by repeatedly performing the processing during the reset period, the exposure period, and the reading period. Alternatively, the detection device 1 may start the detection operation when having detected that the finger Fg, for example, is in contact with or in proximity to the detection surface. When the partial detection areas PAA have a configuration not including the capacitive elements Ca, the processing during the exposure period and the reading period may be performed during the same period. In this case, the first switching element Tr couples the photoelectric conversion element PD to the signal line SGL during the exposure period. As a result, the current corresponding to the irradiating light flows from the photoelectric conversion element PD to each of the signal lines SGL.

Figure 5:
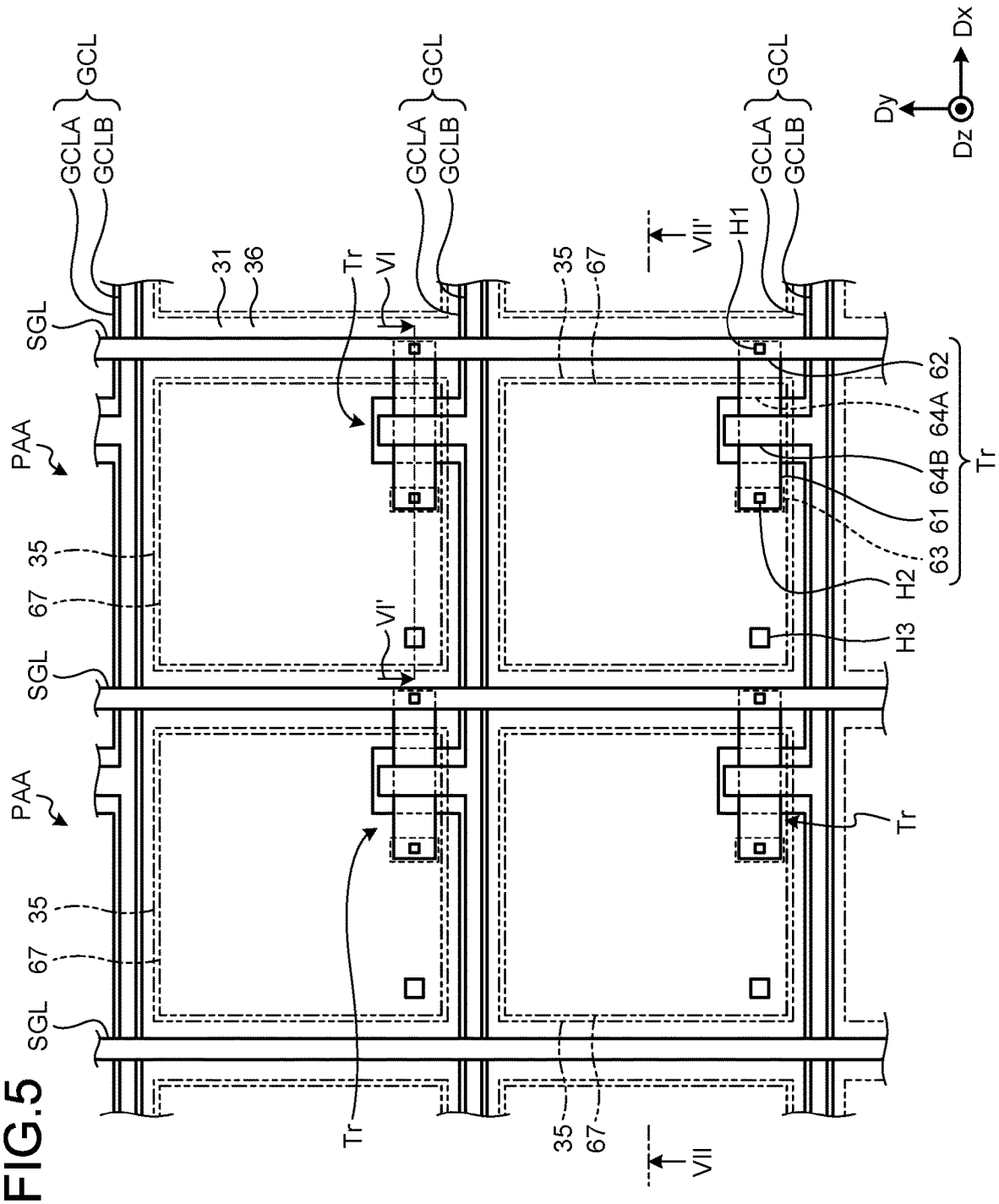
FIG. 5 is a plan view schematically illustrating the partial detection areas of the detection device according to the first embodiment.
Figure 6:
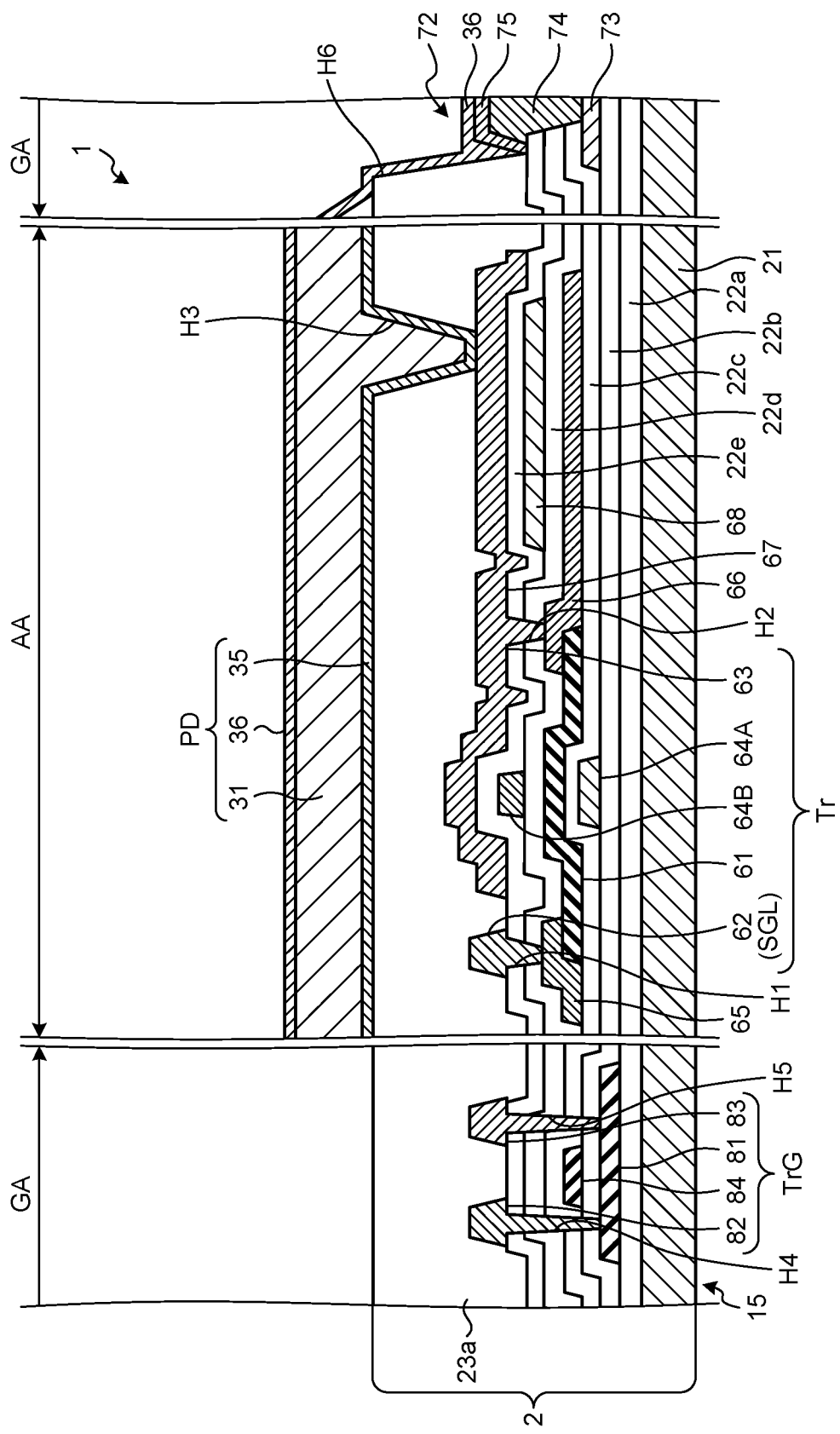
FIG. 6 is a VI-VI' sectional view of FIG. 5.

The following describes a detailed configuration of the detection device 1. FIG. 5 is a plan view schematically illustrating the partial detection areas of the detection device according to the first embodiment. FIG. 6 is a VI-VI' sectional view of FIG. 5. For ease of viewing, FIG. 5 illustrates the detection electrodes 35 and third conductive layers 67 with long dashed double-short dashed lines. To illustrate a relation between a layered structure of the detection area AA and a layered structure of the peripheral area GA, FIG. 6 illustrates the section taken along line VI-VI' and a section of a portion of the peripheral area GA including one of the second switching elements TrG in a schematically connected manner. FIG. 6 also illustrates a section of a portion of the peripheral area GA including a terminal portion 72 in a schematically connected manner.

In the description of the detection device 1, in a direction orthogonal to a surface of the insulating substrate 21, a direction from the insulating substrate 21 toward the counter electrode 36 of the photoelectric conversion element PD will be referred to as the "upper side" or simply as "above", and a direction from the counter electrode 36 toward the insulating substrate 21 will be referred to as the "lower side" or simply as "below". The term "plan view" refers to an arrangement relation as viewed from the direction orthogonal to the surface of the insulating substrate 21.

As illustrated in FIG. 5, the partial detection area PAA is an area surrounded by the gate lines GCL and the signal lines SGL. In the present embodiment, each of the gate lines GCL includes a first gate line GCLA and a second gate line GCLB. The second gate line GCLB is provided so as to overlap the first gate line GCLA. The first gate line GCLA and the second gate line GCLB are provided in different layers with insulating layers (a third inorganic insulating layer 22c and a fourth inorganic insulating layer 22d (refer to FIG. 6)) interposed therebetween. The first gate line GCLA and the second gate line GCLB are electrically coupled to each other at any place, and are supplied with the gate drive signals VGCL having the same potential. At least one of the first gate line GCLA and the second gate line GCLB is coupled to the gate line drive circuit 15. In FIG. 5 and FIG. 6, the first gate line GCLA has a different width from that of the second gate line GCLB. However, the first gate line GCLA may have the same width as that of the second gate line GCLB.

Each of the detection electrodes 35 is provided in the area surrounded by the gate lines GCL and the signal lines SGL. The organic semiconductor layer 31 and the counter electrode 36 are continuously provided so as to cover the detection electrodes 35, the gate lines GCL, the signal lines SGL, and the first switching elements Tr. Each of the third conductive layers 67 is provided in an area overlapping a corresponding one of the detection electrodes 35, and is provided so as to cover a portion of the first switching element Tr. A metal material such as aluminum (Al), copper (Cu), silver (Ag), or molybdenum (Mo), or an alloy of these materials is used as the third conductive layer 67. The third conductive layer 67 serves as a reflective layer for reflecting externally incident light. The third conductive layer 67 also serves as a protection layer for protecting the first switching element Tr.

The first switching element Tr is provided near an intersecting portion between the gate line GCL and the signal line SGL. The first switching element Tr includes a first semiconductor 61, a source electrode 62, a drain electrode 63, a first gate electrode 64A, and a second gate electrode 64B.

One end of the first semiconductor 61 is coupled to the source electrode 62 through a contact hole H1. The other end of the first semiconductor 61 is coupled to the drain electrode 63 through a contact hole H2. A portion of the signal line SGL overlapping the first semiconductor 61 serves as the source electrode 62. A portion of the third conductive layer 67 overlapping the first semiconductor 61 serves as the drain electrode 63. The third conductive layer 67 is coupled to the detection electrode 35 through a contact hole H3. The above-described configuration allows the first switching element Tr to switch between coupling and decoupling of the photoelectric conversion element PD to and from the signal line SGL.

The first semiconductor 61 is an oxide semiconductor. The first semiconductor 61 is more preferably a transparent amorphous oxide semiconductor (TAOS) among types of the oxide semiconductor. Using the oxide semiconductor as the first switching element Tr can reduce a leakage current of the first switching element Tr. As a result, the detection device 1 can restrain reduction in sensitivity in a case of trying to achieve high resolution of the detection.

The first semiconductor 61 is provided along the first direction Dx, and intersects the first gate electrode 64A and the second gate electrode 64B. The first gate electrode 64A and the second gate electrode 64B are provided so as to branch from the first gate line GCLA and the second gate line GCLB, respectively. In other words, portions of the first gate line GCLA and the second gate line GCLB overlapping the first semiconductor 61 serve as the first gate electrode 64A and the second gate electrode 64B, respectively. Aluminum (Al), copper (Cu), silver (Ag), molybdenum (Mo), or an alloy of these materials is used as the first gate electrode 64A and the second gate electrode 64B. A channel area is formed at a portion of the first semiconductor 61 overlapping the first gate electrode 64A and the second gate electrode 64B.

The following describes a layer configuration of the detection device 1. As illustrated in FIG. 6, an array substrate 2 includes, the insulating substrate 21, the first switching element Tr, the second switching element TrG, a first conductive layer 65, a second conductive layer 66, the third conductive layer 67, a fourth conductive layer 68, a first inorganic insulating layer 22a to a fifth inorganic insulating layer 22e, an organic insulating layer 23a, various types of wiring, and the like.

The first switching element Tr is provided above the insulating substrate 21. The insulating substrate 21 is, for example, a glass substrate. Alternatively, the insulating substrate 21 may be a resin substrate or a resin film formed of a resin such as polyimide. When the resin film is used as the insulating substrate 21, the array substrate 2 can be formed to have a curved surface, and thus, the detection device 1 is configured as a sensor having a curved surface corresponding to the shape of the finger Fg or the palm. In the detection device 1, the first switching element Tr including the oxide semiconductor is formed above the insulating substrate 21. As a result, the detection device 1 can easily have an area of the detection area AA larger than that in a case of using a semiconductor substrate such as a silicon substrate.

The first gate electrode 64A is provided above the insulating substrate 21 with a first inorganic insulating layer 22a and a second inorganic insulating layer 22b interposed therebetween. For example, a silicon oxide (SiO) film, a silicon nitride (SiN) film, or a silicon oxynitride (SiON) film is used as each of the first inorganic insulating layers 22a to the fifth inorganic insulating layers 22e. Each of the inorganic insulating layers is not limited to a single layer, but may be a laminated film.

The third inorganic insulating layer 22c is provided above the second inorganic insulating layer 22b so as to cover the first gate electrode 64A. The first semiconductor 61, a first conductive layer 65, and a second conductive layer 66 are provided above the third inorganic insulating layer 22c. The first conductive layer 65 is provided so as to cover an end of the first semiconductor 61 coupled to the source electrode 62. The second conductive layer 66 is provided so as to cover an end of the first semiconductor 61 coupled to the drain electrode 63.

The fourth inorganic insulating layer 22d is provided above the third inorganic insulating layer 22c so as to cover the first semiconductor 61, the first conductive layer 65, and the second conductive layer 66. The second gate electrode 64B is provided above the fourth inorganic insulating layer 22d. The first semiconductor 61 is provided between the first gate electrode 64A and the second gate electrode 64B in a direction orthogonal to the insulating substrate 21. That is, the first switching element Tr has what is called a dual-gate structure. However, the first switching element Tr may have a bottom-gate structure in which the first gate electrode 64A is provided while the second gate electrode 64B is not provided, or a top-gate structure in which only the second gate electrode 64B is provided without the first gate electrode 64A being provided.

The fifth inorganic insulating layer 22e is provided above the fourth inorganic insulating layer 22d so as to cover the second gate electrode 64B. The source electrode 62 (signal line SGL) and the drain electrode 63 (third conductive layer 67) are provided above the fifth inorganic insulating layer 22e. In the present embodiment, the drain electrode 63 is the third conductive layer 67 provided above the first semiconductor 61 with the fourth inorganic insulating layer 22d and the fifth inorganic insulating layer 22e interposed therebetween.

The fourth inorganic insulating layer 22d and the fifth inorganic insulating layer 22e are provided with the contact hole H1 and the contact hole H2. The first conductive layer 65 is exposed at the bottom of the contact hole H1. The source electrode 62 is electrically coupled to the first semiconductor 61 through the contact hole H1 and the first conductive layer 65. In the same manner, the second conductive layer 66 is exposed at the bottom of the contact hole H2. The drain electrode 63 is electrically coupled to the first semiconductor 61 through the contact hole H2 and the second conductive layer 66.

The first conductive layer 65 is provided at a portion overlapping at least the bottom of the contact hole H1 between the source electrode 62 and the first semiconductor 61, and contacts the first semiconductor 61. The second conductive layer 66 is provided at a portion overlapping at least the bottom of the contact hole H2 between the drain electrode 63 and the first semiconductor 61, and contacts the first semiconductor 61. Since the detection device 1 is provided with the first conductive layer 65 and the second conductive layer 66, the first semiconductor 61 can be restrained from being removed by an etching solution when the contact holes H1 and H2 are formed by etching. That is, in the detection device 1, the first switching elements Tr in the detection area AA and the second switching elements TrG in the peripheral area GA can be formed in the same process, so that the manufacturing cost can be reduced.

A metal material such as aluminum (Al), copper (Cu), silver (Ag), or molybdenum (Mo), or an alloy of these materials is used as the first conductive layer 65 and the second conductive layer 66 same as the third conductive layer 67. The first conductive layer 65 and the second conductive layer 66 only need to be made of a conductive material that restrains the etching from progressing when the contact holes H1 and H2 are formed.

The third conductive layer 67 is provided in an area overlapping the photoelectric conversion element PD in the plan view. The third conductive layer 67 is also provided above the first semiconductor 61, the first gate electrode 64A, and the second gate electrode 64B. That is, the third conductive layer 67 is provided between the first switching element Tr and the photoelectric conversion element PD in the direction orthogonal to the insulating substrate 21. This configuration causes the third conductive layer 67 to have a function as a protection layer for protecting the first switching element Tr when the photoelectric conversion element PD is formed on the array substrate 2.

The second conductive layer 66 extends so as to face the third conductive layer 67 in an area not overlapping the first semiconductor 61. A fourth conductive layer 68 is provided above the fourth inorganic insulating layer 22d in an area not overlapping the first semiconductor 61. The fourth conductive layer 68 is provided between the second conductive layer 66 and the third conductive layer 67. This configuration forms a capacity between the second conductive layer 66 and the fourth conductive layer 68, and a capacity between the third conductive layer 67 and the fourth conductive layer 68. The capacities formed by the second conductive layer 66, the third conductive layer 67, and the fourth conductive layer 68 serve as a capacity of the capacitive element Ca illustrated in FIG. 4.

The organic insulating layer 23a is provided above the fifth inorganic insulating layer 22e so as to cover the source electrode 62 (signal line SGL) and the drain electrode 63

(third conductive layer 67). The organic insulating layer 23a is a planarization layer that planarizes asperities formed by the first switching elements Tr and various types of conductive layers.

The photoelectric conversion element PD includes the organic semiconductor layer 31, the detection electrode 35, and the counter electrode 36. The photoelectric conversion element PD is provided above the organic insulating layer 23a of the array substrate 2, and is stacked in the order of the detection electrode 35, the organic semiconductor layer 31, and the counter electrode 36 in the direction orthogonal to the insulating substrate 21.

The detection electrode 35 is the anode of the photoelectric conversion element PD, and is an electrode for reading the detection signal Vdet. The detection electrode 35 is electrically coupled to the third conductive layer 67 through the contact hole H3 provided in the organic insulating layer 23a. For example, a metal material such as molybdenum (Mo) or aluminum (Al) is used as the detection electrode 35. Alternatively, the detection electrode 35 may be a laminated film having a plurality of stacked layers of these metal materials. The detection electrode 35 may be of a light-transmitting conductive material such as indium tin oxide (ITO).

The organic semiconductor layer 31 is continuously provided over the detection electrodes 35. For example, a low-molecular organic material such as C60 (fullerene), phenyl-C61-butyric acid methyl ester (PCBM), copper phthalocyanine (CuPc), fluorinated phthalocyanine (F16CuPc), rubrene (5,6,11,12-tetraphenyltetracene), or PDI (derivative of perylene) can be used as a material of the organic semiconductor layer 31.

A material obtained by combining any of the above-listed low-molecular organic materials with a polymeric organic material is used as the organic semiconductor layer 31. For example, poly(3-hexylthiophene) (P3HT) or F8-alt-benzothiadiazole (F8BT) can be used as the polymeric organic material. The organic semiconductor layer 31 can be a film in a state of a mixture (having a sea-island structure) of P3HT and PCBM, or a film in a state of a mixture of F8BT and PDI. A detailed configuration of the organic semiconductor layer 31 will be described later.

The counter electrode 36 is provided above the organic semiconductor layer 31. That is, the single counter electrode 36 faces the detection electrodes 35. The counter electrode 36 is the cathode of the photoelectric conversion element PD, and is an electrode for applying a common potential to the photoelectric conversion elements PD by being supplied with the power supply signal SVS. The counter electrode 36 is a light-transmitting conductive layer of, for example, ITO. Light L2 reflected by the finger Fg or the palm (refer to FIG. 10) passes through the counter electrode 36, and enters the organic semiconductor layer 31. In the present embodiment, the detection electrode 35 serves as the anode and the counter electrode 36 serves as the cathode. However, the configuration may be reversed. That is, the detection electrode 35 may serve as the cathode, and the counter electrode 36 may serve as the anode.

The peripheral area GA is provided with the second switching elements TrG included in the gate line drive circuit 15. Each of the second switching elements TrG is provided on the same insulating substrate 21 as that of the first switching element Tr. The second switching element TrG includes a second semiconductor 81, a source electrode 82, a drain electrode 83, and a gate electrode 84.

The second semiconductor 81 is of polysilicon. The second semiconductor 81 is more preferably of low-temperature polysilicon (hereinafter, referred to as low-temperature polycrystalline silicon (LTPS)). The second switching element TrG using LIPS can be produced at a process temperature of 600 degrees Celsius or lower. Therefore, circuits such as the gate line drive circuit 15 and the signal line selection circuit 16 can be formed on the same substrate as that for the first switching element Tr. Polysilicon has higher carrier mobility than that of a-Si. Therefore, the detection device 1 can reduce the size of the gate line drive circuit 15 as compared with a case of using a-Si as the second switching element TrG. As a result, the detection device 1 can reduce the area of the peripheral area GA. The second switching element TrG using polysilicon has higher reliability than that obtained using a-Si.

The second semiconductor 81 is provided above the first inorganic insulating layer 22a. That is, the first semiconductor 61 of the first switching element Tr is provided in a position farther away from the insulating substrate 21 than the second semiconductor 81 of the second switching element TrG in the direction orthogonal to the insulating substrate 21. This configuration allows the second semiconductor 81 formed of polysilicon and the first semiconductor 61 formed of the oxide semiconductor to be formed on the same insulating substrate 21.

The gate electrode 84 is provided above the second semiconductor 81 with the second inorganic insulating layer 22b interposed therebetween. The gate electrode 84 is provided in the same layer as that of the second gate electrode 64B. The second switching element TrG has what is called the top-gate structure. However, the second switching element TrG may have the dual-gate structure or the bottom-gate structure.

The source electrode 82 and the drain electrode 83 are provided above the fifth inorganic insulating layer 22e. The source electrode 82 and the drain electrode 83 are provided in the same layer as that of the source electrode 62 and the drain electrode 63 of the first switching element Tr. Contact holes H4 and H5 are provided through from the second inorganic insulating layer 22b to the fifth inorganic insulating layer 22e. The source electrode 82 is electrically coupled to the second semiconductor 81 through the contact hole H4. The drain electrode 83 is electrically coupled to the second semiconductor 81 through the contact hole H5. The contact holes H1 and H2 and the contact holes H4 and H5 of the detection device 1 can be formed in the same process because the first switching element Tr is provided with the first conductive layer 65 and the second conductive layer 66.

Each of the third switching elements TrS included in the signal line selection circuit 16 and each of the fourth switching elements TrR included in the reset circuit 17 illustrated in FIG. 3 may have the same configuration as that of the second switching element TrG. That is, the semiconductor of each of the third switching elements TrS and the fourth switching elements TrR is of polysilicon, and is more preferably of LTPS. In this case, the detection device 1 can reduce the circuit scale of the signal line selection circuit 16 and the reset circuit 17. The semiconductor of each of the third switching elements TrS and the fourth switching elements TrR is not limited to such materials, but may be an oxide semiconductor, including a TAOS.

The terminal portion 72 is provided in a position of the peripheral area GA different from the area provided with the gate line drive circuit 15. The terminal portion 72 includes a first terminal conductive layer 73, a second terminal conductive layer 74, and a third terminal conductive layer 75. The first terminal conductive layer 73 is provided in the same layer as that of the second gate electrode 64B and on the second inorganic insulating layer 22b. A contact hole H6 is provided so as to extend through the third inorganic insulating layer 22c to the fifth inorganic insulating layer 22e, and the organic insulating layer 23a.

The second terminal conductive layer 74 and the third terminal conductive layer 75 are stacked in this order in the contact hole H6, and are electrically coupled to the first terminal conductive layer 73. The second terminal conductive layer 74 can be formed using the same material as and in the same process as those of the third conductive layer 67 and the like. The third terminal conductive layer 75 can be formed using the same material as and in the same process as those of the detection electrode 35. The counter electrode 36 extends to the peripheral area GA, and is electrically coupled to the terminal portion 72. Although FIG. 6 illustrates one terminal portion 72, a plurality of such terminal portions 72 may be arranged with gaps interposed therebetween. The terminal portions 72 may be provided as coupling terminals to the flexible printed circuit board 71 (refer to FIG. 1) or coupling terminals to a drive IC. The detection device 1 may be provided with a protection layer or a cover glass above the counter electrode 36 as needed.

Figure 7:
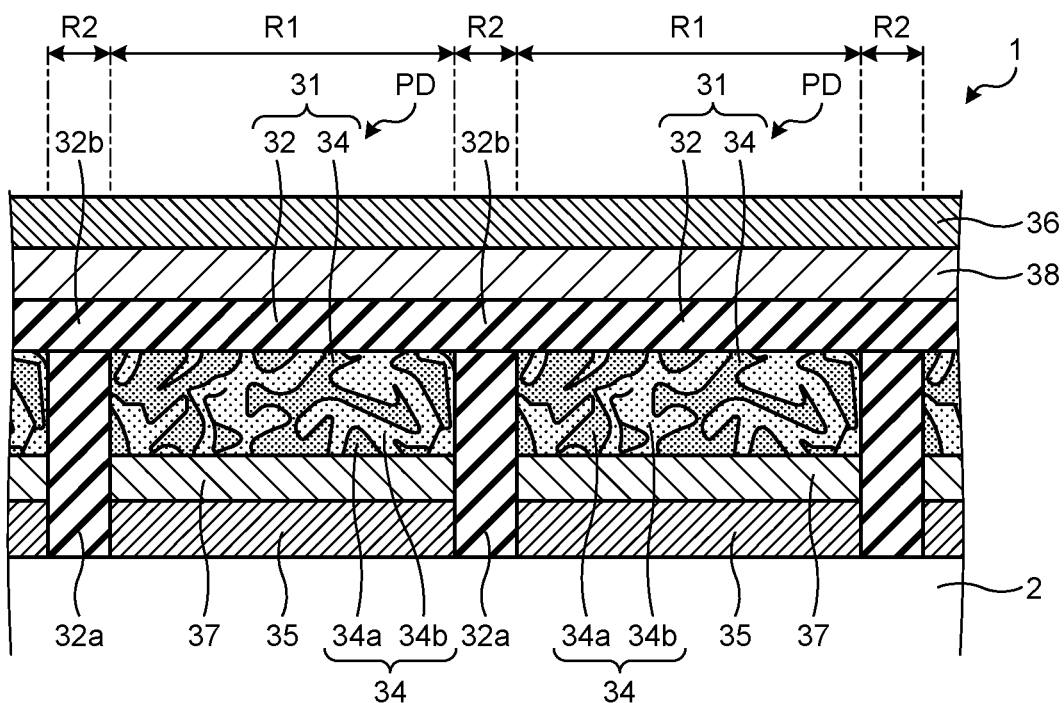
FIG. 7 is a VII-VII' sectional view of FIG. 5.

The following describes a configuration of the organic semiconductor layer 31. FIG. 7 is a VII-VII' sectional view of FIG. 5. FIG. 7 is a sectional view obtained by cutting the partial detection areas PAA illustrated in FIG. 5 along the first direction Dx. The same sectional view as FIG. 7 can also be obtained by cutting the partial detection areas PAA along the second direction Dy. While FIG. 7 illustrates the array substrate 2 in a simplified manner, the detection electrodes 35 are provided on the organic insulating layer 23a of the array substrate 2 (refer to FIG. 6).

The detection electrodes 35 are disposed so as to be separated from one another. Herein, an overlapping area R1 denotes an area overlapping each of the detection electrodes 35. A non-overlapping area R2 denotes an area not overlapping each of the detection electrodes 35, that is, an area between the adjacent detection electrodes 35. The photoelectric conversion element PD is constituted by the detection electrode 35, the organic semiconductor layer 31, and the counter electrode 36 stacked in each of the overlapping areas R1.

The organic semiconductor layer 31 and the counter electrode 36 are provided over the overlapping areas R1 and the non-overlapping areas R2 so as to cover the detection electrodes 35. The organic semiconductor layer 31 includes a p-type semiconductor layer 32 and an active layer 34 that is formed by mixing a p-type semiconductor 34a with an n-type semiconductor 34b. The organic semiconductor layer 31 has different configurations in the overlapping area R1 and the non-overlapping area R2. Specifically, in the overlapping area R1, the organic semiconductor layer 31 includes a buffer layer 37 (first buffer layer), the p-type semiconductor layer 32 (second p-type semiconductor layer), the active layer 34, and a buffer layer 38 (second buffer layer). The active layer 34 is provided between the p-type semiconductor layer 32 and the buffer layer 37 in the direction orthogonal to the insulating substrate 21. The p-type semiconductor layer 32 (second p-type semiconductor layer 32b) and the buffer layer 38 are provided between the active layer 34 and the counter electrode 36. The p-type semiconductor layer 32 (second p-type semiconductor layer 32b) and the buffer layer 38 are disposed over the overlapping areas R1 and the non-overlapping areas R2. A plurality of the buffer layers 37 are provided. The buffer layers 37 are provided between the active layers 34 and the detection electrodes 35, and are provided so as to be separated from one another on a per detection electrode 35 basis. In the present embodiment, the detection electrodes 35, the buffer layers 37, the active layer 34, the p-type semiconductor layer 32, the buffer layer 38, and the counter electrode 36 are stacked in this order in the direction orthogonal to the insulating substrate 21.

The active layer 34 has a bulk hetero structure in which the p-type semiconductor 34a and the n-type semiconductor 34b are mixed and coexist. The active layer 34 has a configuration in which the p-type semiconductor 34a and the n-type semiconductor 34b are distributed at a desired ratio (for example, at a ratio of 1:2), and the density distribution is graded in the vertical direction such that the ratio between the p-type semiconductor 34a and the n-type semiconductor 34b is such that p-type semiconductor 34a>n-type semiconductor 34b and n-type semiconductor 34b>p-type semiconductor 34a near the detection electrode 35 and the counter electrode 36. When the active layer 34 is irradiated with light, electron-hole pairs are generated in each of the p-type semiconductor 34a and the n-type semiconductor 34b. Each of the holes and the electrons generated in the active layer 34 moves in the active layer 34, and moves toward the detection electrode 35 (anode) or the counter electrode 36 (cathode).

The buffer layers 37 and 38 are provided for facilitating the holes and the electrons generated in the active layer 34 to reach the detection electrode 35 or the counter electrode 36. The buffer layer 37 serves as an electron transport layer (or a hole blocking layer), and the buffer layer 38 serves as a hole transport layer (electron blocking layer). For example, ZnO or polyethylenimine can be used as a material of the buffer layer 37. For example, $WO_3$, $MoO_3$, or polyethylenedioxythiophene (PEDOT)/polystyrene sulfonic acid (PSS) can be used as a material of the buffer layer 38. The p-type semiconductor layer 32 is in contact with the p-type semiconductor 34a and the n-type semiconductor 34b included in the active layer 34. For example, P3HT among the above-listed organic materials is used as the p-type semiconductor layer 32 and the p-type semiconductor 34a of the active layer 34. For example, PCBM among the above-listed organic materials is used as an n-type semiconductor layer 33 (refer to FIG. 8) and the n-type semiconductor 34b of the active layer 34.

In the overlapping area R1, the ratio of the p-type semiconductor (including the p-type semiconductor layer 32 and the p-type semiconductor 34a of the active layer 34) to the n-type semiconductor (including the n-type semiconductor 34b of the active layer 34) in the organic semiconductor layer 31 varies in the direction orthogonal to the insulating substrate 21. When the ratio per unit volume of the p-type semiconductor to the n-type semiconductor is denoted as a ratio RT (=volume of p-type semiconductor/volume of n-type semiconductor), the ratio RT decreases in the order of the p-type semiconductor layer 32 and the active layer 34 in the direction orthogonal to the insulating substrate 21.

In the non-overlapping area R2, the organic semiconductor layer 31 is configured by including at least either of the p-type semiconductor layer 32 constituted by the p-type semiconductor and the n-type semiconductor layer 33 constituted by the n-type semiconductor. In the present embodiment, in the non-overlapping area R2, a first p-type semiconductor layer 32a, the second p-type semiconductor layer 32b, the buffer layer 38, and the counter electrode 36 are stacked in this order in the direction orthogonal to the insulating substrate 21. That is, in the non-overlapping area R2, the active layer 34 having the bulk hetero structure is not provided, and the first p-type semiconductor layer 32a and the second p-type semiconductor layer 32b are stacked so as to contact each other in the direction orthogonal to the insulating substrate 21.

The first p-type semiconductor layer 32a of the non-overlapping area R2 is provided above the organic insulating layer 23a of the array substrate 2 (refer to FIG. 6). The first p-type semiconductor layer 32a is continuously provided over a gap between the adjacent detection electrodes 35. The first p-type semiconductor layer 32a is continuously provided over a gap between the adjacent active layers 34.

The second p-type semiconductor layer 32b in the non-overlapping area R2 is provided so as to be continuous to the p-type semiconductor layer 32 provided in the overlapping area R1. The p-type semiconductor layer 32 is continuously provided over the overlapping areas R1 and the non-overlapping areas R2, and is provided above the active layer 34 and the first p-type semiconductor layer 32a.

As described above, in the organic semiconductor layer 31, the active layer 34 is provided in each of the overlapping areas R1. In the non-overlapping area R2, the first p-type semiconductor layer 32a is continuously provided between the active layers 34 and between the detection electrodes 35. This configuration can more effectively restrain the holes or the electrons generated in the active layers 34 from moving between the detection electrodes 35 than in a case where the active layer 34 is continuously provided over the overlapping areas R1 and the non-overlapping areas R2. For example, even when one of the detection electrodes 35 and the other of the detection electrodes 35 adjacent to each other are set to different potentials by being irradiated with light, the holes or the electrons generated in the active layers 34 can be restrained from moving from one of the detection electrodes 35 to the other of the detection electrodes 35. Accordingly, the detection device 1 can reduce the leakage current between the detection electrodes 35. As a result, the detection device 1 can achieve high resolution of the detection.

The configuration of the organic semiconductor layer 31, the detection electrode 35, and the counter electrode 36 illustrated in FIG. 5 to FIG. 7 is merely an example, and can be modified as appropriate. For example, the shape in the plan view of the detection electrode 35 is not limited to the rectangle, and may be another shape such as a polygon or an irregular shape.

Figure 8:
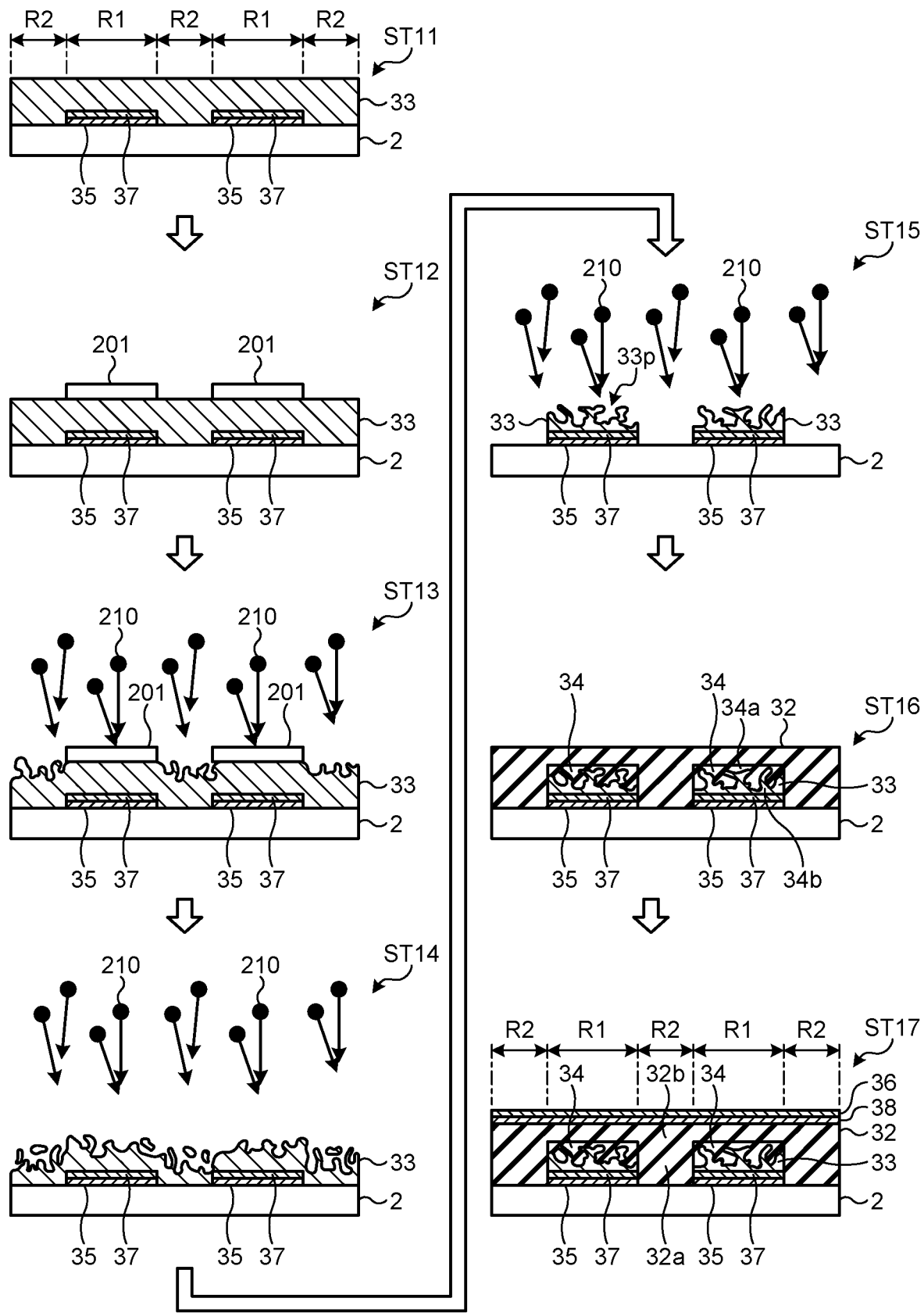
FIG. 8 is an explanatory diagram for explaining an exemplary method for manufacturing the detection device according to the first embodiment.

FIG. 8 is an explanatory diagram for explaining an exemplary method for manufacturing the detection device according to the first embodiment. As illustrated in FIG. 8, a film forming device forms the n-type semiconductor layer 33 above the array substrate 2 so as to cover the detection electrodes 35 and the buffer layers 37 (Step ST11). The n-type semiconductor layer 33 is formed using an application method, such as a spin coating method, a screen printing method, or an ink-jet printing method.

Then, the film forming device forms a resist layer 201 above the n-type semiconductor layer 33 (Step ST12). The resist layer 201 is formed in the overlapping areas R1, and is not formed in the non-overlapping areas R2. That is, in the non-overlapping areas R2, the n-type semiconductor layer 33 is formed so as to be exposed from the resist layer 201. The resist layer 201 is formed using an application method or a photolithography method.

Then, the film forming device performs dry etching to remove the resist layer 201 and the n-type semiconductor layer 33 in the non-overlapping areas R2 (Step ST13). Reactive ion etching (hereinafter, referred to as "RIE") can be employed as the dry etching. The RIE uses an oxygen gas containing oxygen ($O_2$) molecules 210.

The film forming device further performs the RIE to remove the resist layer 201 and remove the n-type semiconductor layer 33 exposed in the overlapping areas R1 (Step ST14). Since the polymeric organic material is used, the RIE removes portions of the n-type semiconductor layer 33 in the overlapping areas R1, but does not remove the other portions thereof. Thus, a porous structure 33p having many fine pores is formed.

Since the resist layer 201 is present, the etching in the non-overlapping areas R2 progresses more than in the overlapping areas R1. As a result, the n-type semiconductor layer 33 is removed to expose a surface of the array substrate 2 in the non-overlapping areas R2, and the porous structure 33p is formed in the n-type semiconductor layer 33 in the overlapping areas R1 (Step ST15).

The film forming device forms the p-type semiconductor layer 32 over the overlapping areas R1 and the non-overlapping areas R2 (Step ST16). The p-type semiconductor layer 32 is formed to fill the pores of the porous structure 33p, and thus, the active layers 34 in which the p-type semiconductor 34a and the n-type semiconductor 34b are mixed and coexist are formed in the overlapping areas R1. In the non-overlapping areas R2, the p-type semiconductor layer 32 is formed as a single layer above the array substrate 2.

The film forming device forms the counter electrode 36 and the buffer layer 38 above the p-type semiconductor layer 32 (Step ST17). The counter electrode 36 and the buffer layer 38 are continuously formed over the overlapping areas R1 and the non-overlapping areas R2. The counter electrode 36 and the buffer layer 38 are formed using a thin film method such as sputtering or vapor deposition. The above-described process can form the organic semiconductor layer 31 having the different configurations in the overlapping areas R1 and the non-overlapping areas R2. Specifically, the active layer 34 is separately patterned in each of the overlapping areas R1, and in the non-overlapping area R2, the p-type semiconductor layer 32 (first p-type semiconductor layer 32a) is provided between the active layers 34 and between the detection electrodes 35.

The process illustrated in FIG. 8 is merely an example. The method for manufacturing the detection device 1 can be modified as appropriate. For example, a metal mask may be used instead of the resist layer 201.

Second Embodiment

Figure 9:
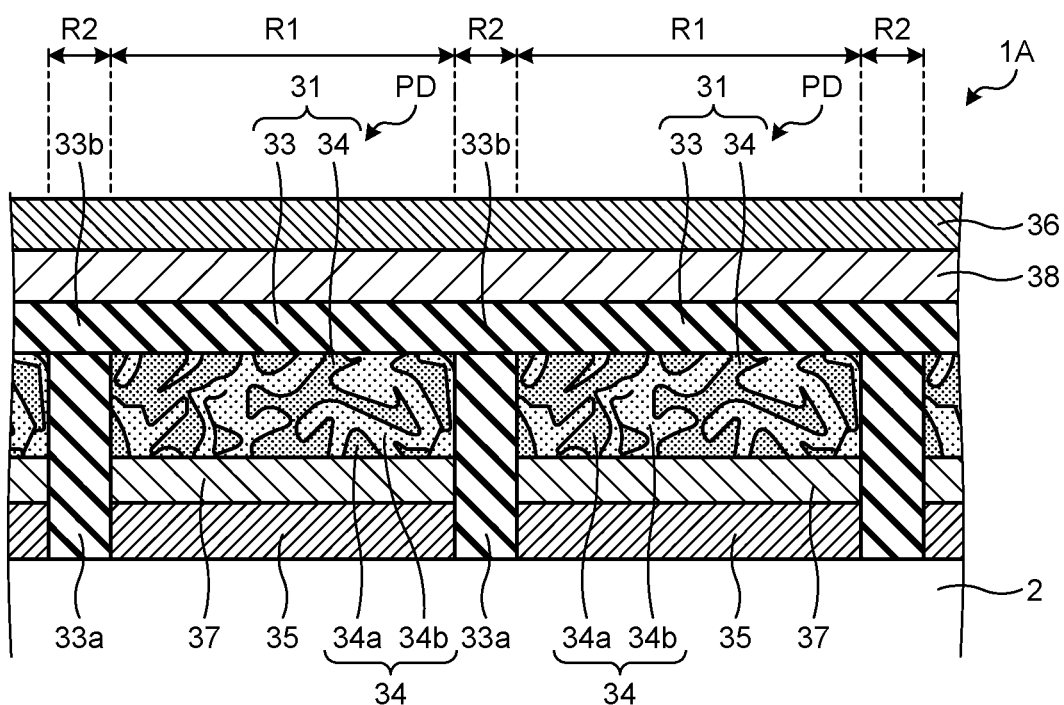
FIG. 9 is a sectional view illustrating a schematic sectional configuration of a detection device according to a second embodiment of the present disclosure.

FIG. 9 is a sectional view illustrating a schematic sectional configuration of a detection device according to a second embodiment of the present disclosure. In the following description, the same components as those described in the above-described embodiment will be denoted by the same reference numerals, and the description thereof will not be repeated.

As illustrated in FIG. 9, a detection device 1A of the second embodiment is provided with the n-type semiconductor layer 33 instead of the p-type semiconductor layer 32, as compared with the first embodiment. Specifically, in the non-overlapping area R2, the n-type semiconductor layer 33 is provided as a single layer, and is continuously provided from the surface of the array substrate 2 between the adjacent detection electrodes 35 to the counter electrode 36. In the non-overlapping area R2, a first n-type semiconductor layer 33a, a second n-type semiconductor layer 33b, the buffer layer 38, and the counter electrode 36 are stacked in this order above the array substrate 2, and the p-type semiconductor layer 32 is not provided. Similar to the first embodiment, the layered structure of the overlapping area R1 is stacked in the order of the detection electrodes 35, the buffer layers 37, the active layer 34, the n-type semiconductor layer 33, the buffer layer 38, and the counter electrode 36 in the direction orthogonal to the insulating substrate 21.

That is, the n-type semiconductor layer 33 (second n-type semiconductor layer) and the buffer layer 38 are included between the active layer 34 and the counter electrode 36, and the n-type semiconductor layer 33 and the buffer layer 38 are disposed over the overlapping areas R1 and the non-overlapping areas R2. In the non-overlapping area R2, the first n-type semiconductor layer 33a and the second n-type semiconductor layer 33b are stacked so as to contact each other in the direction orthogonal to the insulating substrate 21. The second n-type semiconductor layer 33b in the non-overlapping area R2 is provided so as to be continuous to the n-type semiconductor layer 33 in the overlapping area R1. The first n-type semiconductor layer 33a in the non-overlapping area R2 is provided between the adjacent detection electrodes 35, and is also provided between the adjacent active layers 34.

Also in the second embodiment, the active layer 34 is provided in each of the overlapping areas R1. In the non-overlapping area R2, the first n-type semiconductor layer 33a is continuously provided between the active layers 34 and between the detection electrodes 35. With this configuration, the detection device 1A can reduce the leakage current between the detection electrodes 35.

Third Embodiment

Figure 10:
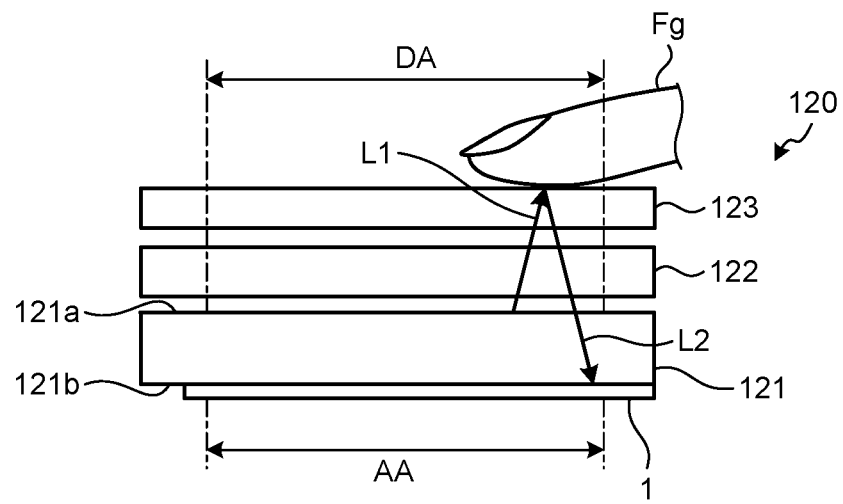
FIG. 10 is a sectional view illustrating a schematic sectional configuration of a display device according to a third embodiment of the present disclosure.

FIG. 10 is a sectional view illustrating a schematic sectional configuration of a display device according to a third embodiment of the present disclosure. As illustrated in FIG. 10, a display device 120 includes the detection device 1, a display panel 121, a touchscreen panel 122, and a cover glass 123. The display panel 121 may be, for example, an organic electroluminescent (EL) (organic light-emitting diode (OLED)) display panel or an inorganic EL (micro-LED or mini-LED) display using light-emitting elements as the display elements. Alternatively, a display panel 121 may be a liquid crystal display (LCD) panel that uses liquid crystal elements as the display elements, or an electrophoretic display (EPD) panel that uses electrophoretic elements as the display elements.

The display panel 121 has a first principal surface 121a and a second principal surface 121b that is the opposite side of the first principal surface 121a. The first principal surface 121a is a surface that emits light L1 from display elements toward the cover glass 123 to display an image. The first principal surface 121a has a display area DA in which the image is displayed.

The touchscreen panel 122 uses, for example, a capacitance method to detect the finger Fg in contact with or in proximity to a surface of the cover glass 123. The touchscreen panel 122 is transmissive of light, and can transmit the light L1 and light L2 that has been reflected on an interface between the cover glass 123 and air. The display device 120 may have a configuration not including the touchscreen panel 122. The display panel 121 may be integrated with the touchscreen panel 122, or may incorporate functions of the touchscreen panel 122.

The cover glass 123 is a member for protecting, for example, the display panel 121, and covers, for example, the display panel 121. The cover glass 123 is, for example, a glass substrate. The present disclosure is not limited to using the cover glass 123. For example, a resin substrate may be provided above the touchscreen panel 122.

The detection device 1 is provided so as to face the second principal surface 121b of the display panel 121. The detection device 1 can detect the asperities of the surface of the finger Fg by detecting the light L2 reflected by the finger Fg. Alternatively, the detection device 1 can detect the biological information such as a vain pattern, the pulse wave, and the pulsation by detecting the light L2 reflected in the finger Fg. Since the detection device 1 can be easily increased in area, the detection area AA of the detection device 1 is provided so as to face the entire display area DA of the display panel 121. The detection area AA is not limited to this configuration, and may face a portion of the display area DA of the display panel 121. The detection device 1 is not limited to the configuration of being provided as the display device 120, and may be configured as a biometric authentication device including the detection device 1 and a light source. In this case, the detection device 1 is not limited to the configuration of detecting the light L2 reflected by, for example, the finger Fg, and can employ a configuration of detecting the light L2 having passed through, for example, the finger Fg.

Fourth Embodiment

Figure 11:
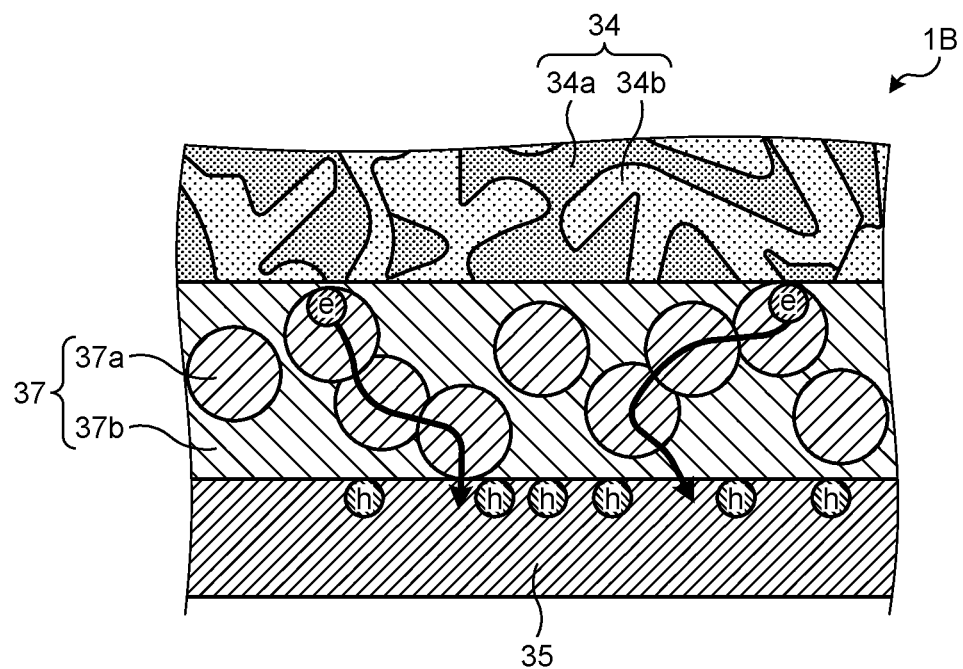
FIG. 11 is a sectional view schematically illustrating a buffer layer of a detection device according to a fourth embodiment of the present disclosure.

FIG. 11 is a sectional view schematically illustrating the buffer layer of a detection device according to a fourth embodiment of the present disclosure. As illustrated in FIG. 11, in a detection device 1B of the fourth embodiment, the buffer layer 37 (first buffer layer) includes zinc oxide (ZnO) nanoparticles 37a and a zinc acetate layer 37b. The zinc oxide nanoparticles 37a are dispersed between the active layer 34 and the detection electrode 35. The zinc acetate layer 37b is provided in a space among the zinc oxide nanoparticles 37a between the active layer 34 and the detection electrode 35. The zinc acetate layer 37b is provided so as to fill the space among the zinc oxide nanoparticles 37a, and contacts the active layer 34 and the detection electrode 35. The buffer layer 37 can be formed by using and applying ink obtained by mixing the zinc oxide nanoparticles 37a with the zinc acetate layer 37b.

The zinc oxide nanoparticles 37a are provided for facilitating the electrons generated in the active layer 34 to reach the detection electrode 35, and serve as an electron transport layer. At the same time, the zinc acetate layer 37b serves as a hole blocking layer for restricting the movement of the holes.

With this configuration, the buffer layer 37 can reduce the movement of the holes passing through the space among the zinc oxide nanoparticles 37a, for example, as compared with a case where the buffer layer 37 is formed as a single film of the zinc oxide nanoparticles 37a without including the zinc acetate layer 37b. As a result, a dark current can be reduced when the photoelectric conversion element PD is driven in the reverse bias state.

The level of the dark current can be controlled by the concentration of the zinc acetate layer 37b, that is, the ratio between the zinc oxide nanoparticles 37a and the zinc acetate layer 37b. For example, the dark current varies with the zinc acetate concentration of a zinc acetate mixed solution used in the buffer layer 37. The concentration of the zinc acetate layer 37b is more preferably from 0.3 mol/L to 0.4 mol/L. In the present embodiment, the dark current can be reduced to approximately one hundredth to one tenth that in the case where the buffer layer 37 is formed as a single film of the zinc oxide nanoparticles 37a.

While the preferred embodiments of the present disclosure have been described above, the present disclosure is not limited to the embodiments described above. The content disclosed in the embodiments is merely an example, and can be variously modified within the scope not departing from the gist of the present disclosure. Modifications appropriately made within the scope not departing from the gist of the present disclosure naturally belong to the technical scope of the present disclosure.

What is claimed is:

1. A detection device comprising:
a substrate;
a plurality of detection electrodes arranged in a detection area of the substrate;
an organic semiconductor layer covering the detection electrodes;
a counter electrode provided above the organic semiconductor layer; and
a plurality of first buffer layers,
wherein
the organic semiconductor layer includes at least either of a first p-type semiconductor layer and a first n-type semiconductor layer, and an active layer,
the active layer is provided in each overlapping area overlapping a corresponding one of the detection electrodes, and has a structure in which a p-type semiconductor and an n-type semiconductor are mixed and coexist,
the first p-type semiconductor layer or the first n-type semiconductor layer is provided in a non-overlapping area not overlapping the detection electrode, and is provided between the adjacent active layers,
the first buffer layers are provided between the active layers and the detection electrodes, and are provided so as to be separated from one another on a per detection electrode basis, and
the first buffer layers each include a plurality of zinc oxide nanoparticles and a zinc acetate layer provided in a space among the zinc oxide nanoparticles.

2. The detection device according to claim 1, further comprising a second p-type semiconductor layer and a second buffer layer between the active layer and the counter electrode, the second p-type semiconductor layer and the first second buffer layer being disposed over the overlapping area and the non-overlapping area, wherein
in the non-overlapping area, the first p-type semiconductor layer and the second p-type semiconductor layer are stacked so as to contact each other in a direction orthogonal to the substrate.

3. The detection device according to claim 1, further comprising a second n-type semiconductor layer and a first second buffer layer between the active layer and the counter electrode, the second n-type semiconductor layer and the second buffer layer being disposed over the overlapping area and the non-overlapping area, wherein
in the non-overlapping area, the first n-type semiconductor layer and the second n-type semiconductor layer are stacked so as to contact each other in a direction orthogonal to the substrate.

4. The detection device according to claim 1, wherein a ratio of the p-type semiconductor to the n-type semiconductor in the overlapping area varies in a direction orthogonal to the substrate.

5. The detection device according to claim 1, wherein at least either of the first p-type semiconductor layer and the first n-type semiconductor layer is provided between the adjacent detection electrodes.

6. The detection device according to claim 1, comprising an array substrate in which the substrate, a plurality of switching elements provided for the respective detection electrodes on the substrate, a plurality of gate lines, a plurality of signal lines, and a planarization layer covering the switching elements, the gate lines, and the signal lines are included, wherein
the detection electrodes, the organic semiconductor layer, and the counter electrode are provided above the planarization layer.

* * * * *